Sept. 5, 1961 D. BOSWELL ET AL 2,999,194
SEMICONDUCTOR DEVICES
Filed March 6, 1957
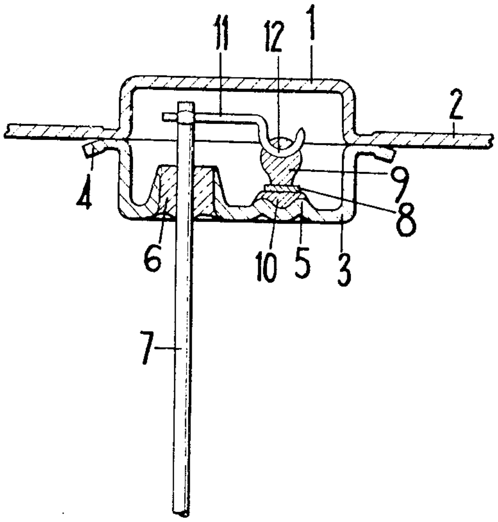
INVENTORS
David Boswell
John Ewels
BY
Kirschstein, Kirschstein & Ottinger
ATTORNEYS United States Patent Office 2,999,194

Patented Sept. 5, 1961

2,999,194

SEMICONDUCTOR DEVICES

David Boswell, Mill Hill, London, and John Ewels, Harrow, England, assignors to The General Electric Company Limited, London, England Filed Mar. 6, 1957, Ser. No. 644,382
Claims priority, application Great Britain Mar. 12, 1956
6 Claims. (Cl. 317—234)

This invention relates to semiconductor devices.

It is an object of the invention to provide a form of construction for a semiconductor device which is convenient both in respect of assembly of the device and in respect of cooling the device in operation.

According to the invention, a semiconductor device includes a semiconductor body mounted in a hermetically sealed envelope which consists of a plain metallic part and a second metallic part sealed together, the semiconductor body being secured to the second part of the envelope in good electrical and thermal contact therewith and having in contact with it at least one electrode provided with a lead sealed in electrically insulated relationship through the second part of the envelope.

Preferably, the two parts of the envelope are sealed together by cold pressure welding.

Copper is a preferred material for both the two parts of the envelope and the electrode lead or leads.

In one preferred embodiment of the invention at least one of the two parts of the envelope is formed integral with a metallic sheet which extends outwards from the envelope all round the seal between the two parts, so as to form a cooling fin and/or mounting bracket for the device.

One arrangement in accordance with the invention will now be described by way of example with reference to the accompanying drawing, which is a sectional view of a silicon P-N junction rectifier.

The rectifier incorporates a wafer of N-type silicon, which has fused to it during manufacture two beads of tin respectively disposed centrally on opposite main faces of the wafer; one of the beads contains aluminum, so that a P-N junction is formed in the silicon at the base of this bead, which will be referred to for convenience as the junction bead. The assembly of the wafer and tin beads may conveniently be prepared in the manner disclosed in the specification of copending Patent application No. 628,784.

Referring now to the drawing, the rectifier has an envelope consisting of two parts, one constituted by a circular cylindrical depression 1 pressed into a plane sheet of copper 2, so that its axis is perpendicular to the plane of the sheet 2, and the other constituted by a shallow circular cylindrical copper cup 3 having the same diameter as the depression 1 and having formed around its mouth a flange 4 projecting radially outwards. The cup 3 has formed in its base an inwardly projecting dimple 5, the base of which is concave to the inside of the cup 3, and also has sealed through it a glass bead 6 through which is sealed a copper wire 7 which extends parallel to the axis of the cup 3 and projects beyond the mouth of the cup 3. The glass used for the bead 6 preferably has a composition in accordance with British Patent application No. 14,977/56; for example the glass may suitably have a composition (by weight) of 42% silica, 20% titanium dioxide, 17% sodium oxide, 14% potassium oxide, 4% strontium oxide, and 3% barium oxide.

During manufacture, the silicon wafer 8 is secured to the cup 3 by placing the wafer 8 on the inner face of the base of the dimple 5, which has initially been tinned, with the junction bead 9 uppermost, heating the assembly thus formed to a temperature of about 250° C., and then cooling the assembly to room temperature. During this operation the tin in the two beads melts, and then resolidifies, the junction bead 9 retaining its form substantially unaltered, and the tin 10 from the other bead serving to solder the wafer 8 to the cup 3 so that the wafer 8 is in good electrical and thermal contact with the cup 3. A second copper wire 11 is then soldered to the bead 9 and the wire 7 in the following manner. The cup 3 is disposed with its axis vertical and its mouth uppermost, and the wire 11 is held by its ends with intermediate portions respectfully in contact with the outermost part of the bead 9 and the part of the wire 7 which projects beyond the mouth of the cup 3, these portions of the wire 11 having been initially tinned; the portion of the wire 11 in contact with the wire 7 extends horizontally, while the portion in contact with the bead 9 is constituted by the angle of a bend 12 in the wire 11 which points downwards. The assembly thus formed is heated to a temperature of about 200° C., and an electric current is passed through the wire 11 to bring its temperature to about 250° C. and bring about the soldering, the assembly thereafter being cooled to room temperature, whereupon the bead 9 assumes the final form shown in the drawing. During the soldering operation only a portion of the bead 9 in contact with the wire 11 is melted, while the tin 10 is not melted at all. After the soldering operation, the ends of the wire 11 beyond the soldered points are cropped off, so that the wire 11 assumes the final form shown in the drawing. It will be appreciated that the wires 7 and 11 together form a lead for the electrode constituted by the bead 9.

In order to improve the reverse characteristics of the completed rectifier, the bead 9 and the main face of the wafer 8 to which the bead 9 is fused are then treated with an etching reagent whose effect is to remove excess tin from the region of the periphery of the P-N junction and to clean the surface of the wafer 8; a suitable reagent for this purpose is one consisting of three volumes of glacial acetic acid, five volumes of concentrated nitric acid, and three volumes of hydrofluoric acid, together with about 0.3% of bromine. The etching is carried out by filling the cup 3 with the reagent, the surfaces of the parts of the assembly inside the cup 3 other than those which are to be treated having previously been covered by a suitable masking material; it is desirable that the surface of the glass bead 6 on the outside of the cup 3 should also be masked to prevent damage due to accidental contact with the etching reagent. It has been found that a particularly suitable masking material is plasticised polyvinyl chloride, which may be painted on to the surfaces to be protected in an uncured state and then cured, by heating the assembly to a temperature 150° C., to form a rubbery gel, which adheres well to the surfaces to be protected without any undesirable reaction, but which can be readily stripped mechanically from these surfaces without leaving any undesirable residue after it has performed its masking function. After the etching treatment the assembly is washed in distilled water and dried.

The envelope of the rectifier is then completed by placing the sheet 2 in contact with the flange 4 on the cup 3 so that the mouth of the depression 1 coincides with the mouth of the cup 3, and then cold pressure welding the flange 4 to the sheet 2 all round the flange 4, the cold welding operation being carried out in an atmosphere of dry nitrogen so as to provide a permanent inert gaseous filling for the envelope. As is usual in cold pressure welding, the surfaces of the parts to be welded together are thoroughly cleaned, for example by scratch brushing, immediately prior to the welding operation.

It will be appreciated that the construction of the rectifier described above is such that the manufacturing operations prior to the final sealing of the envelope can conveniently be carried out while all the parts of the rectifier are readily accessible, while the final sealing of the envelope can be carried out in a simple manner, without requiring any complex lining-up procedure for the parts of the envelope. It will be further appreciated that the copper sheet 2 can be used as a cooling fin and/or mounting bracket for the rectifier, and that its formation integral with a part of the envelope and the plain form of this part of the envelope lead to further convenience in manufacture. Furthermore, the good electrical and thermal contact between the silicon wafer 8 and the envelope allows the envelope itself to be used as one of the terminals of the rectifier, and leads to efficient dissipation of the heat generated in the rectifier in operation. Finally, the form of the rectifier is such as to facilitate the construction of relatively compact assemblies when a number of rectifiers are required to be utilised together as an operational unit.

While the arrangement described above is specifically concerned with a rectifier, the invention is equally applicable in the case of semiconductor devices, such as transistors, in which more than one electrode in contact with the semiconductor body requires a lead sealed through the envelope. For example in the case of a junction transistor, a semiconductor body containing two P-N junctions may be mounted with one of the two regions of like conductivity type in contact with the second part of the envelope, electrodes respectively in contact with the other two regions being provided with separate leads sealed through that part of the envelope.

We claim:

1. A semiconductor device including a semiconductor body mounted in a hermetically sealed envelope which consists of a plain metallic part and a second metallic part directly sealed together by cold pressure welding, the semiconductor body being secured to the second part of the envelope in good electrical and thermal contact therewith and having in contact with it at least one electrode provided with a lead sealed in electrically insulated relationship through the second part of the envelope.

2. A semiconductor device according to claim 1, in which each electrode lead is of copper.

3. A semiconductor device according to claim 1, in which the two parts of the envelope are of copper.

4. A semiconductor device according to claim 1, in which at least one of the two parts of the envelope is formed integral with a metallic sheet which extends outwards from the envelope all round the seal between the two parts.

5. A semiconductor device according to claim 1, in which the envelope has an inert gaseous filling.

6. A semiconductor device including semiconductor body mounted in a hermetically sealed envelope which consists of a plain copper part and a second copper part directly sealed together, the semiconductor body being secured to the second part of the envelope in good electrical and thermal contact therewith and having in contact with it at least one electrode provided with a copper lead sealed in electrically insulated relationship through the second part of the envelope by means of a glass consisting substantially by weight of 42% silica, 20% titanium dioxide, 17% sodium oxide, 14% potassium oxide, 4% strontium oxide and 3% barium oxide.

References Cited in the file of this patent

UNITED STATES PATENTS

| | | |
|---|---|---|
| 2,722,638 | Atkins | Nov. 1, 1955 |
| 2,744,218 | Burton et al. | May 1, 1956 |
| 2,745,044 | Lingel | May 8, 1956 |
| 2,773,224 | Lehovec | Dec. 4, 1956 |
| 2,796,563 | Ebers et al. | June 18, 1957 |
| 2,810,873 | Knott | Oct. 22, 1957 |
| 2,817,048 | Thuermel et al. | Dec. 17, 1957 |
| 2,825,014 | Willemse | Feb. 25, 1958 |
| 2,825,857 | Salecker | Mar. 4, 1958 |
| 2,829,422 | Fuller | Apr. 8, 1958 |
| 2,842,831 | Pfann | July 15, 1958 |
| 2,853,661 | Houle et al. | Sept. 23, 1958 |
| 2,886,748 | Barton | May 12, 1959 |
| 2,887,628 | Zierdt | May 19, 1959 |
| 2,905,873 | Ollendorf | Sept. 22, 1959 |